(12) United States Patent
Bunyan et al.

(10) Patent No.: US 7,208,192 B2
(45) Date of Patent: Apr. 24, 2007

(54) THERMALLY OR ELECTRICALLY-CONDUCTIVE FORM-IN-PLACE GAP FILTER

(75) Inventors: Michael H. Bunyan, Chelmsford, MA (US); Miksa de Sorgo, Middlesex, NH (US)

(73) Assignee: Parker-Hannifin Corporation, Cleveland, OH (US)

( * ) Notice: Subject to any disclaimer, the term of this patent is extended or adjusted under 35 U.S.C. 154(b) by 267 days.

(21) Appl. No.: 10/346,346

(22) Filed: Jan. 16, 2003

(65) Prior Publication Data

US 2003/0222249 A1 Dec. 4, 2003

Related U.S. Application Data

(60) Provisional application No. 60/385,145, filed on May 31, 2002.

(51) Int. Cl.
*B05D 5/00* (2006.01)
*B05D 5/12* (2006.01)

(52) U.S. Cl. .......................... 427/58; 427/77; 427/197; 427/201; 427/385.5; 252/500; 252/511; 428/447; 428/334; 174/350; 174/391; 156/307.3; 156/48

(58) Field of Classification Search ................ 252/500, 252/511, 518.1; 250/515.1; 523/137; 156/48, 156/145, 307.3, 60
See application file for complete search history.

(56) References Cited

U.S. PATENT DOCUMENTS

| 4,299,715 A | 11/1981 | Whitfield et al. |
| 4,384,610 A | 5/1983 | Cook et al. |
| 4,466,483 A | 8/1984 | Whitfield et al. |
| 4,473,113 A | 9/1984 | Whitfield et al. |
| 4,561,011 A | 12/1985 | Konara et al. |
| 4,575,432 A | 3/1986 | Lin et al. |
| 4,643,924 A | 2/1987 | Uken et al. |
| 4,654,754 A | 3/1987 | Daszkowski |
| 4,685,987 A | 8/1987 | Fick |
| 4,722,960 A | 2/1988 | Dunn et al. |
| 4,755,249 A | 7/1988 | DeGree et al. |

(Continued)

FOREIGN PATENT DOCUMENTS

| DE | 4320527 | * 12/1993 |
| EP | 0 643 551 B1 | 4/2000 |
| FR | 2 570 383 | 3/1986 |
| JP | 57137356 | 8/1982 |
| JP | 58002050 | 1/1983 |
| JP | 200134233 | 12/2001 |
| JP | 2002294269 | 10/2002 |
| WO | WO 96/05602 A1 | 2/1996 |
| WO | WO 00/63968 | 10/2000 |

OTHER PUBLICATIONS

Chromerics Bulletin #63, pp. 4, Oct. 1999.*

(Continued)

*Primary Examiner*—Mark Kopec
*Assistant Examiner*—Kallambella Vijayakumar
(74) *Attorney, Agent, or Firm*—John A. Molnar, Jr.

(57) ABSTRACT

Application of a thermally and/or electrically conductive compound to fill a thermal and/or EMI shielding gap between a first and a second surface. A supply of a fluent, form-stable compound is provided as an admixture of a cured polymer gel component, and a particulate filler component. An of the compound is dispensed from a nozzle or other orifice under an applied pressure onto one of the surfaces which, when opposed, form the gap, or into the gap formed between the surfaces. The gap is at least partially filled by at least a portion of the dispensed compound.

17 Claims, 1 Drawing Sheet

U.S. PATENT DOCUMENTS

| | | | |
|---|---|---|---|
| 4,782,893 | A | 11/1988 | Thomas |
| 4,842,911 | A | 6/1989 | Fick |
| 4,852,646 | A | 8/1989 | Dittner et al. |
| 4,869,954 | A | 9/1989 | Squitieri |
| 4,915,167 | A | 4/1990 | Altoz |
| 5,008,485 | A * | 4/1991 | Kitagawa ............... 174/35 GC |
| 5,060,114 | A | 10/1991 | Feinberg et al. |
| 5,079,300 | A | 1/1992 | Dubrow et al. |
| 5,137,959 | A | 8/1992 | Block et al. |
| 5,167,851 | A | 12/1992 | Jamison et al. |
| 5,170,930 | A | 12/1992 | Dolbear et al. |
| 5,194,480 | A | 3/1993 | Block et al. |
| 5,213,868 | A | 5/1993 | Liberty et al. |
| 5,250,209 | A | 10/1993 | Jamison et al. |
| 5,291,371 | A | 3/1994 | Gruber et al. |
| 5,298,791 | A | 3/1994 | Liberty et al. |
| 5,328,087 | A | 7/1994 | Nelson et al. |
| 5,352,731 | A | 10/1994 | Nakano et al. |
| 5,467,251 | A | 11/1995 | Katchmar |
| 5,545,473 | A | 8/1996 | Ameen et al. |
| 5,641,438 | A * | 6/1997 | Bunyan et al. ............ 264/40.3 |
| 5,665,809 | A | 9/1997 | Wojtowicz |
| 5,679,457 | A | 10/1997 | Bergerson |
| 5,741,877 | A | 4/1998 | Tiffany |
| 5,781,412 | A | 7/1998 | De Sorgo |
| 5,783,862 | A | 7/1998 | Deeney |
| 5,796,582 | A | 8/1998 | Katchmar |
| 5,798,171 | A | 8/1998 | Olson |
| 5,852,092 | A * | 12/1998 | Nguyen ..................... 524/404 |
| 5,910,524 | A * | 6/1999 | Kalinoski ................... 523/215 |
| 5,929,138 | A | 7/1999 | Mercer et al. |
| 5,930,893 | A | 8/1999 | Eaton |
| 6,031,025 | A | 2/2000 | Mercer et al. |
| 6,195,267 | B1 | 2/2001 | MacDonald |
| 6,197,859 | B1 | 3/2001 | Green et al. |
| 6,254,939 | B1 | 7/2001 | Cowan et al. |
| 6,303,180 | B1 * | 10/2001 | Bunyan et al. ............... 427/58 |

OTHER PUBLICATIONS

Material Safety Data Sheet, T644A/T642A, pp. 10, 2000.*

IBM Technical Disclosure Bulletin, vol. 30, No. 12, dated May 1, 1988 entitled "Filled Silicone Get As a Thermal Transfer Medium in Electronic Packages".

International Search Report in corresponding International Application No. PCT/US03/03406.

Chomerics Data Sheet for Thermal Products—Therm-A-Form Thermally Conductive Compounds. Applicants request the Examiner to consider this reference as prior art under 102(a), however, Applicants respectfully reserve the right to supplement this Information Disclosure Statement and take a contrary position should it be necessary.

Chomerics Preliminary Product Data Sheet for Therm-A-Gap™ G974. Applicants request the Examiner to consider this reference as prior art under 102(a), however, Applicants respectfully reserve the right to supplement this Information Disclosure Statement and take a contrary position should it be necessary.

Chomerics Preliminary Products Information for Therm-A-Ga™ G174. Applicants request the Examiner to consider this reference as prior art under 102(a), however, Applicants respectfully reserve the right to supplement this Information Disclosure Statement and take a contrary position should it be necessary.

Chomerics Preliminary Products Information for G574. Applicants request the Examiner to consider this reference as prior art under 102(a), however, Applicants respectfully reserve the right to supplement this Information Disclosure Statement and take a contrary position should it be necessary.

Chomerics Technical Bulletin 63—Therm-A Form™ Form-in-Place Thermal Interface Compounds and Encapsulants. Copyrighted 1999.

Chomerics Technical Bulletin 70—Therm-A-Gap™ Interface Materials Highly Conformable, Thermally Conductive Gap Fillers. Copyrighted 1999.

Chomerics Technical Bulletin 77—Thermflow™ T705 and T710 Low Thermal Resistance Interface Pads. Copyrighted 1977.

Chomerics Technical Bulletin 78—Thermflow™ T310 Phase Change Thermal Interface Materials. Copyrighted 1998.

Information about Dow Corning® brand Dielectric Gels. Applicants request the Examiner to consider this reference as prior art under 102 (a), however, Applicants respectfully reserve the right to supplement this Information Disclosure Statement and take a contrary position should it be necessary.

Article entitled Thermal Gap Fillers: New Material Overcomes Performance Trade-Offs by Kent Young. Applicants request the Examiner to consider this reference as prior art under 102 (a), however, Applicants respectfully reserve the right to supplement this Information Disclosure Statement and take a contrary position should it be necessary.

NuSil Technology Product Profile GEL-8100 High Purity Dielectric, Soft Silicone Gel. Applicants request the Examiner to consider this reference as prior art under 102 (a), however, Applicants respectfully reserve the right to supplement this Information Disclosure Statement and take a contrary position should it be necessary.

* cited by examiner

THERMALLY OR ELECTRICALLY-CONDUCTIVE FORM-IN-PLACE GAP FILTER

CROSS-REFERENCE TO RELATED CASES

The present application claims the benefit of the filing date of U.S. Provisional Application Ser. No. 60/385,145; filed May 31, 2002, the disclosure of which is expressly incorporated herein by reference.

FIELD OF THE INVENTION

The present invention relates broadly to thermally and/or electrically-conductive compounds which may be used as gap fillers or caulks between, for example, the surfaces of an electronic component and another member, such as a heat sink or circuit board, for the conductive cooling and/or the electromagnetic interference (EMI) shielding thereof. More particularly, the invention relates to the application, such as by dispensing through a nozzle, of such a compound which is provided in the form of a cured polymer gel filled with thermally and/or electrically-conductive particulates to one of the surface or into a gap between the surfaces.

BACKGROUND OF THE INVENTION

Circuit designs for modem electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmically or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

That is, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a pad or other layer of a thermally-conductive, electrically-insulating material often is interposed between the heat sink and electronic component to fill in any surface irregularities and eliminate air pockets. Initially employed for this purpose were materials such as silicone grease or wax filled with a thermally-conductive filler such as aluminum oxide. Such materials, as may be further described in U.S. Pat. Nos. 5,250,209; 5,167,851; 4,764,845; 4,473,113; 4,473,113; 4,466,483; and 4,299,715, usually are semi-liquid or solid at normal room temperature, but may liquefy or soften at elevated temperatures to flow and better conform to the irregularities of the interface surfaces.

The greases and waxes of the aforementioned types heretofore known in the art, however, generally are not self-supporting or otherwise form stable at room temperature and are considered to be messy to apply to the interface surface of the heat sink or electronic component. To provide these materials in the form of a film which often is preferred for ease of handling, a substrate, web, or other carrier must be provided which introduces another interface layer in or between which additional air pockets may be formed. Moreover, use of such materials typically involves hand application or lay-up by the electronics assembler which increases manufacturing costs.

Alternatively, another approach is to substitute a cured, sheet-like material in place of the silicone grease or wax. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is are alumina or boron nitride-filled silicone or urethane elastomers which is marketed under the name CHO-THERM® and THERM-A-GAP™ by the Chomerics Division of Parker-Hannifin Corp., 16 Flagstone Drive, Hudson, N.H. 03051. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1–50 microns (0.05–2 mils). Similar materials may be described in U.S. Pat. Nos. 5,679,457; 5,545,473; 5,533, 256; 5,510,174; 5,471,027; 5,359,768; 5,321,582; 5,309, 320; 5,298,791; 5,213,868; 5,194,480; 5,151,777; 5,137,959; 5,060,114; 4,979,074; 4,974,119; 4,965,699; 4,869,954; 4,842,911; 4,782,893; 4,685,987; 4,654,754; 4,606,962; 4,602,678, and in WO 96/37915. Other materials, as may be described in U.S. Pat. Nos. 6,031,025; 5,929,138; 5,741,877; 5,665,809; 5,467,251; 5,079,300; 4,852,646; and in WO 96/05602, WO 00/63968; and EP 643,551, may use a gel or gel-like material as a binder or carrier for the filler.

Sheets, pads, and tapes of the above-described types have garnered general acceptance for use as interface materials in the conductive cooling of electronic component assemblies such as the semiconductor chips, i.e., dies, described in U.S. Pat. No. 5,359,768. In certain applications, however, heavy fastening elements such as springs, clamps, and the like are required to apply enough force to conform these materials to the interface surfaces in order to attain enough surface for efficient thermal transfer. Indeed, for some applications, materials such as greases and waxes which liquefy, melt, or soften at elevated temperature continue to be preferred as better conforming to the interface surfaces under relatively low clamping pressures.

Recently, phase-change materials have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These phase-change materials, which may be supplied as free-standing films, or as heated screen printed onto a substrate surface, advantageously function much like greases and waxes in conformably flowing within the operating temperature of the component under relatively low clamping pressures of about 5 psi (35 kPa). Such materials are further described in commonly-assigned U.S. Pat. No. 6,054,198 and U.S. Ser. No. 09/212,111, filed Dec. 15, 1998 and entitled "Method of Applying a Phase Change Interface Material," and are marketed commercially under the names THERMFLOW® T310, T443, T705, T710, T725, and A725 by the Chomerics Division of Parker-Hannifin Corp., 16 Flagstone Drive, Hudson, N.H. 03051. Other phase-change materials are marketed commercially by the Bergquist Company (Minneapolis, Minn.) under the tradename "HI-FLOW™," by Thermagon, Inc. (Cleveland, Ohio) under the tradenames "T-PCM™" and by Orcus, Inc. (Stilwell, KS) under the tradename "THERMAPHASE." A phase-change material/metal foil laminate is marketed by Thermagon, Inc. under the tradename "T-MATE™."

For typical commercial application, the thermal interface material may be supplied in the form of a tape or sheet which includes an inner and outer release liner and an interlayer of thermal compound. Unless the thermal compound is inherently tacky, one side of the compound layer may be coated with a thin layer of a pressure-sensitive adhesive (PSA) for the application of the compound to the heat transfer surface of a heat sink. In order to facilitate automated dispensing and application, the outer release liner and compound interlayer of the tape or sheet may be die cut to form a series of individual, pre-sized pads. Each pad thus may be removed from the inner release liner and bonded to the heat sink using the adhesive layer in a conventional "peel and stick" application which may be performed by the heat sink manufacturer.

With the pad being adhered to the heat transfer surface of the thermal dissipation member such as a heat sink or spreader, and with the outer liner in place to form a protective cover the outer surface of the compound layer, the dissipation member and pad may be provided as an integrated assembly. Prior to installation of the assembly, the outer release liner is removed from the compound layer, and the pad positioned on the electronic component. A clamp may be used to secure the assembly in place.

Other materials, as exemplified in U.S. Pat. No. 5,467,251, and in commonly-assigned U.S. Pat. No. 5,781,412, and as marketed commercially by the Chomerics Division of Parker-Hannifin Corp. under the name "THERM-A-FORM™," are commonly referred to as thermal interface compounds, caulks, form-in-place materials, or encapsulants. These materials typically are supplied as charged within one or more tubes, containers, and the like as, most often, one or two-part liquid or otherwise fluent, filled reactive systems which cure at room or elevated temperatures to be formed-in-place within the gap or component to which the compound is applied. Application may be cartridge or tube guns or other dispensing systems.

In view of the variety of materials and applications, as exemplified in the foregoing, used in thermal management, it is to be expected that continued improvements in such materials and applications in thermal management materials would be well-received by electronics manufacturers.

BROAD STATEMENT OF THE INVENTION

The present invention is directed to a thermally and/or electrically-conductive compound which is dispensable, such under an applied pressure as issued as a bead or mass from a nozzle or other orifice. The compound, which may be charged in a tube, cartridge, or other container, may be dispensed onto a surface which forms, a gap with an opposing, faying, mating, or otherwise adjoining surface, or directly into the gap formed between the adjoining surface. As applied, the compound forms a bead or mass of material "in place," i.e., in situ. Within the gap, the formed-in-place bead or mass of the compound functions as an interface material in being conformable to at least partially fill the gap and to thereby provide a thermally and/or electrically-conductive pathway between the surfaces.

Unlike conventional "form-in-place" materials, however, the compound of the present invention is substantially fully cross-linked or otherwise cured as charged within the tube, cartridge, or other container, or as otherwise supplied. Thus, the compound of the present invention may be stored at room temperature and does not require refrigerated or other special storage. The compound also, while being of a fluent viscosity which is dispensable under an applied pressure, is generally viscoelastic and, as filled, exhibits no appreciable settling of the filler. Such compound also has, effectively, an unlimited shelf-life and working time, and can be provided as a one-part system which does not require mixing by the user prior to dispensing, or a cure schedule following dispensing. The dispensed compound, whether applied as a bead, mass, or other form, is generally form-stable and thereby may be handled for assembly similar to a conventional molded or extruded strip, pad, sheet, or other preform. The dispensed bead or mass, moreover, while being form-stable is also extremely soft and conformable requiring low or substantially no force in deflection. The compound may be applied using automated dispensing equipment, or otherwise applied such with a pneumatically or manually-operated applicator gun.

In an illustrative embodiment with the precepts of the present invention, the compound is formulated as being fluent under an applied pressure, yet form-stable as applied to a surface or within a gap, as a blend or other admixture of: (I) a polymer gel component; and (II) a filler which may be thermally and/or electrically-conductive particles or a blend thereof. The gel component may be, for example, a thermoplastic gel or a silicone gel which may be an organopolysiloxane. Advantageously, the compound may be filled, such as to a loading level of between about 20–80% by total weight, to exhibit a thermal conductivity of at least about 0.5 W/m-K which is comparable to that exhibited by current molded or form-in-place materials, but while still being dispensable using conventional equipment The present invention, accordingly, comprises the combination of elements and steps which are exemplified in the detailed disclosure to follow. Advantages of the present invention includes a thermal compound which is dispensable for form-in-place application, but which does not requiring curing. Further advantages include a thermal compound which is extremely soft and conformable. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
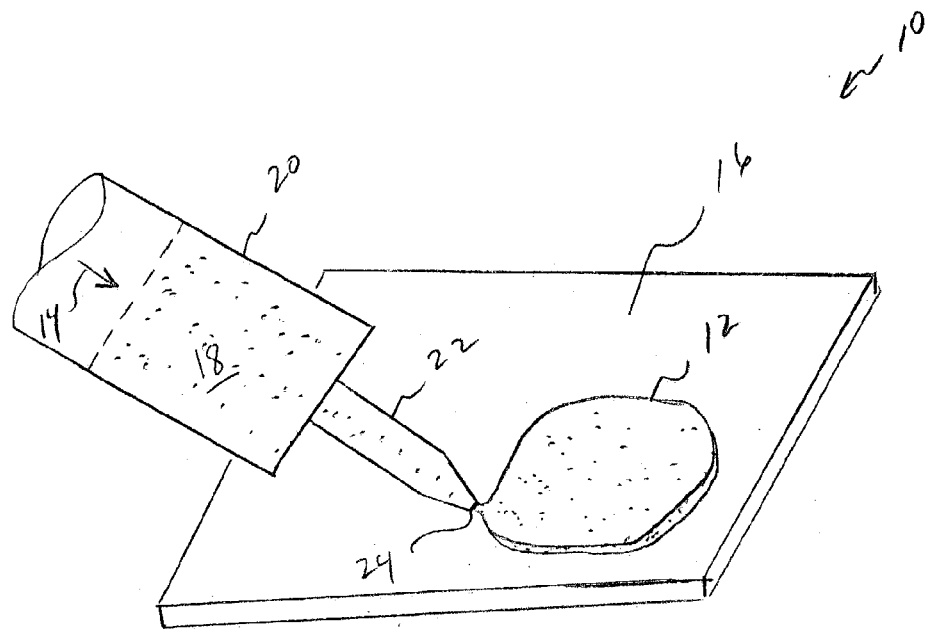
FIG. 1 is a perspective, somewhat schematic view of a representative application of the thermally and/or electrically-conductive compound of the present invention as dispensed onto a surface.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "interior," "inner," or "inboard" and "outward," "exterior," "outer," or "outboard" referring, respectively, to directions toward and away from the center of the referenced element, and the terms "radial" or "horizontal" and "axial" or "vertical" referring, respectively, to directions, axes, planes perpendicular and parallel to the central longitudinal axis of the referenced element. Terminology of similar import other than the words specifically mentioned above likewise is to be considered as being used for purposes of convenience rather than in any limiting sense. Further, the term "EMI shielding" should be understood to include, and to be used interchangeably with, electromagnetic compatibility (EMC), electrical conduction and/or grounding, corona shielding, radio frequency interference (RFI) shielding, and anti-static, i.e., electro-static discharge (ESD) protection.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the illustrative purposes of the discourse to follow, the thermally and/or electrically-conductive compound of the invention herein involved is principally described in connection with a formulation thermally-conductive formulation particularly adapted for use within a thermal management assembly as a thermal interface material which may be dispensed as a bead, mass, or other form onto a heat transfer surface of a thermal dissipation member such as a heat sink for heat transfer contact with a mating heat transfer surface of a electronic component. Such assemblies and thermal interface materials therefor are elsewhere described in U.S. Pat. Nos. 6,096,414; 6,054,198; 5,798,171; 5,766,740; 5,679,457; 5,545,473; 5,533,256; 5,510,174; 5,471,027; 5,359,768; 5,321,582; 5,309,320; 5,298,791; 5,250,209; 5,213,868; 5,194,480; 5,137,959; 5,167,851; 5,151,777; 5,060,114; 4,979,074; 4,974,119; 4,965,699; 4,869,954; 4,842,911; 4,782,893; 4,764,845; 4,685,987; 4,654,754; 4,606,962; 4,602,678; 4,473,113; 4,466,483; 4,299,715; and 3,928,907. It will be appreciated, however, that aspects of the present invention may find use in other thermal management applications, and in other forms such as a caulk. The compound of the invention, as formulated to be additionally or alternatively electrically-conductive, also may find use as a form-in-place EMI shielding material. Such uses and applications therefore should be considered to be expressly within the scope of the present invention.

In accordance with the precepts of the present invention, a fluent compound is provided as exhibiting, in gross morphological aspects, a continuous gel phase and a discrete phase of a particulate filler dispersed in the continuous phase. Such compound, which is both fluent and viscous or viscoelastic, is especially adapted for use as a form-in-place (FIP) thermal interface or EMI shielding gasket material in being dispensable as a generally non-slumping or otherwise form-stable bead, mass, or other form which is issued from a nozzle or other orifice onto the surface of a substrate such as a heat sink or electronic component. The bead, mass, or other form so dispensed is conformal so as to be capable of filling gaps between adjoining surfaces of the circuitry components, circuit boards, and housings of electronic devices and electrical equipment, or between other adjoining surfaces such as may be found in building structures and the like.

In an exemplary formulation, the compound of the present invention is formulated as a fluent admixture of: (a) a cured polymer gel component; (b) a filler component. By "fluent," it is meant that the admixed composition exhibits representative fluid flow characteristics allowing it to be extruded under pressure through a dispensing nozzle, needle, or other orifice at a given flow velocity. For example, flow rates through a 0.047 inch (1 mm) orifice of about 2 g/min under an applied pressure of about 90 psi (620 kPa) may be observed. The cured compound, moreover, is provided to be sufficiently viscous or viscoelastic, e.g., about 15 million cps, at about normal room temperature, i.e., about 25–30° C., such that the composition may be dispensed from a nozzle, needle, or other orifice as a generally form-stable bead, mass, or other form. By "form-stable," it is meant that the quantity of the composition which is applied to the substrate exhibits, at steady-state, substantially no appreciable, i.e., 25% or less, slump, sag, running, or other flow, at least at temperatures within the range of normal room temperature. By "cured" it is meant that the gel component, and, unless containing a reactive adjuvant or diluent, the compound itself, does not exhibit, except as may normally develop upon aging, further appreciable polymerization, cross-linking, vulcanization, hardening, drying, or other like chemical or physical change such as from its fluent gel form into a solid or semi-solid form or phase.

Gels useful as the polymer gel component include systems based on silicones, i.e., polysiloxanes, such as polyorganosiloxane, as well as systems based on other polymers, which may be thermoplastic or thermosetting, such as polyurethanes, polyureas, fluoropolymers, chlorosulfonates, polybutadienes, butyls, neoprenes, nitrites, polyisoprenes, and buna-N, copolymers such as ethylene-propylene (EPR), styrene-isoprene-styrene (SIS), styrene-butadiene-styrene (SBS), ethylene-propylene-diene monomer (EPDM), nitrile-butadiene (NBR), styrene-ethylene-butadiene (SEB), and styrene-butadiene (SBR), and blends thereof such as ethylene or propylene-EPDM, EPR, or NBR. As used herein, the term "polymer gel" is ascribed, in one sense, its conventional meaning of a fluid-extended polymer system which may include a continuous polymeric phase or network, which may be chemically, e.g., ionically or covalently, or physically cross-linked, and an oil, such as a silicone or other oil, a plasticizer, unreacted monomer, or other fluid extender which swells or otherwise fills the interstices of the network. The cross-linking density of such network and the proportion of the extender can be controlled to tailor the modulus, i.e., softness, and other properties of the gel. The term "polymer (or silicone as the case may be) gel" also should be understood to encompass materials which alternatively may be classified broadly as pseudogels or gel-like as having viscoelastic properties similar to gels, such has by having a "loose" cross-linking network formed by relatively long cross-link chains, but as, for example, lacking a fluid-extender.

As to silicone gels, particularly preferred are soft silicone gels such as marketed under the name "GEL-8100" by NuSil Technology (Carpinteria, Calif.). Such gel in its cured condition has a penetration value, such as per ASTM D217, of about $100 \times 10^{-1}$ mm. Other soft silicone gels are marketed under the designation "3-6636" by Dow Corning (Midland, Mich.).

In accordance with one aspect of the present invention, the polymer gel component is rendered thermally-conductive via its loading with a filler component which may comprise one or more thermally-conductive particulate fillers. In this regard, the polymer gel component generally forms a binder into which the thermally-conductive filler is dispersed. The filler is included in proportion sufficient to provide the thermal conductivity desired for the intended application, and generally will be loaded at between about 20–80% by total weight of the compound. The size and shape of the filler is not critical for the purposes of the present invention. In this regard, the filler may be of any general shape, referred to broadly as "particulate," including solid or hollow spherical or microspherical flake, platelet, irregular, or fibrous, such as chopped or milled fibers or whiskers, but preferably will be a powder to assure uniform dispersal and homogeneous mechanical and thermal properties. The particle size or distribution of the filler typically will range from between about 0.01–10 mil (0.25–250 µm), which may be a diameter, imputed diameter, length, or other dimension of the particulate, but may further vary depending upon the thickness of the gap to be filled. If desired, the filler may be selected as being electrically-nonconductive such that compound may be both dielectric or electrically-insulating and thermally-conductive. Alternatively, the filler may be electrically-conductive in applications where electrical isolation is not required.

Suitable thermally-conductive fillers generally include oxide, nitride, carbide, diboride, graphite, and metal particles, and mixtures thereof, and more particularly boron nitride, titanium diboride, aluminum nitride, silicon carbide, graphite, metals such as silver, aluminum, and copper, metal oxides such as aluminum oxide, magnesium oxide, zinc oxide, beryllium oxide, and antimony oxide, and mixtures thereof. Such fillers characteristically exhibit a thermal conductivity of between about 20–50 W/m-K. For reasons of economy, an aluminum oxide, i.e., alumina, may be used, while for reasons of improved thermal conductivity a boron nitride would be considered more preferred. Loaded with the thermally-conductive filler, the compound typically may exhibit a thermal conductivity, per ASTM D5470, of at least about 0.5 W/m-K and a thermal impedance, also per ASTM D5470, of less than about 1° C. in $^2$/W (6° C.-cm$^2$/W), but as may vary depending upon the thickness of the compound layer.

In accordance with another aspect of the present invention, the polymer gel component is rendered electrically-conductive via its loading with an electrically-conductive filler, which may be provided in addition to, i.e., a blend, or instead of a thermally-conductive filler. Also, depending upon the filler selected, such filler may function as both a thermally and an electrically-conductive filler.

Suitable electrically-conductive fillers include: noble and non-noble metals such as nickel, copper, tin, aluminum, and nickel; noble metal-plated noble or non-noble metals such as silver-plated copper, nickel, aluminum, tin, or gold; non-noble metal-plated noble and non-noble metals such as nickel-plated copper or silver; and noble or non-noble metal plated non-metals such as silver or nickel-plated graphite, glass, ceramics, plastics, elastomers, or mica; and mixtures thereof. The filler again may be broadly classified as "particulate" in form, although the particular shape of such form is not considered critical to the present invention, and may include any shape that is conventionally involved in the manufacture or formulation of conductive materials of the type herein involved including hollow or solid microspheres, elastomeric balloons, flakes, platelets, fibers, rods, irregularly-shaped particles, or a mixture thereof. Similarly, the particle size of the filler is not considered critical, and may be or a narrow or broad distribution or range, but in general will be between about 0.250"250 µm.

The filler is loaded in the composition in a proportion sufficient to provide the level of electrical conductivity and EMI shielding effectiveness within the gap which is desired for the intended application. For most applications, an EMI shielding effectiveness of at least 10 dB, and usually at least 20 dB, and preferably at least about 60 dB or higher, over a frequency range of from about 10 MHz to 10 GHz is considered acceptable. Such effectiveness translates to a filler proportion which generally is between about 10–80% by volume or 50–90% by weight, based on the total volume or weight, as the case may be, of the compound, and a bulk or volume resistivity of not greater than about 1 Ω-cm, although it is known that comparable EMI shielding effectiveness may be achieved at lower conductivity levels through the use of an EMI absorptive or "lossy" filler such as a ferrite or nickel-coated graphite. As is also known, the ultimate shielding effectiveness of member 32 will vary based on the amount of the electrically-conductive or other filler material, and on the film thickness.

Additional fillers and additives may be included in the formulation of the compound depending upon the requirements of the particular application envisioned. Such fillers and additives may include conventional wetting agents or surfactants, pigments, dyes, and other colorants, opacifying agents, anti-foaming agents, anti-static agents, coupling agents such as titanates, chain extending oils, tackifiers, pigments, lubricants, stabilizers, emulsifiers, antioxidants, thickeners, and/or flame retardants such as aluminum trihydrate, antimony trioxide, metal oxides and salts, intercalated graphite particles, phosphate esters, decabromodiphenyl oxide, borates, phosphates, halogenated compounds, glass, silica, which may be fumed or crystalline, silicates, mica, and glass or polymeric microspheres. Typically, these fillers and additives are blended or otherwise admixed with the formulation, and may comprise between about 0.05–80% or more by total volume thereof.

The compound may be prepared, for example, in a roll mill or other conventional mixing apparatus as an admixture of one or more resins or other polymers which may also be oligomers or prepolymers, optionally, depending upon the system, a cross-linking agent, catalyst, and extender, the filler component, and optional additive components. The admixture or blend, during or after mixing, may be subjected to conditions which polymer, further polymerize, or otherwise cure or convert the resin, oligomer, or prepolymer into a fluid or non-fluid extended polymer gel component. In this regard, the admixture may be heated, such as in the case of a thermal addition polymerization, i.e., vulcanization or cross-linking, system. Alternatively, the chemical or physical gellation reaction may be under the influence of atmospheric moisture, i.e., hydrolysis, exposure to ultraviolet (UV) radiation, or other curing mechanism such an anaerobic cure. Depending upon the polymer gel system employed, an inorganic or organic solvent or other diluent or Theological agent may be added to control the viscosity of the final cured compound which may be adjusted for the application equipment or process to be used. As mentioned, the viscosity of the final compound typically may be about 15 million cps at about 25–30° C. The compound may also be foamed prior to or after mixing, such as under the control of a physical blowing agent, such as nitrogen, carbon dioxide, or other gas, or a chemical blowing agent, which may be an organic compound or an inorganic compound such as water, which decomposes or volatilizes to generate a gas. After mixing and curing, the substantially fully-cured and mixed may be charged into individual tubes, cartridges, or containers and stored for later application using, for example, a hand-held applicator gun or syringe, or, alternatively, automated metering and dispensing equipment such as a robotic applicator.

Referring now to the figures wherein corresponding reference characters are used to designate corresponding elements throughout the several views with equivalent elements being referenced with prime or sequential alphanumeric designations, an illustrative spray application of the admixed and cured compound of the present invention is shown generally at 10 in FIG. 1. In FIG. 1, a mass or "blob," 12, of the compound is shown as being dispensed under an applied pressure, illustrated by the arrow 14, onto a primed or unprimed surface, 16, which may be a plastic, metal, or ceramic surface of, for example, a heat sink, cold plate, circuit board, housing part, or electronic component. In this regard, a supply of the compound, referenced at 18, is shown to be charged as a one-part system into a cartridge, tube, or other container, 20, connected in fluid communication, which may be direct as shown or via hose or other conduit connected to a head, with a nozzle, 22, having an orifice, 24.

Under the applied pressure 12, which may be manually applied using a gun or syringe, or developed by air or airless metering equipment such as a proportioning cylinder or a pump, a metered amount of the compound may be issued from nozzle 22 and onto the surface 16. As applied, the blob 12 may be substantially self-adherent to the surface 16, such as by surface tension, an inherent tack, or other cohesive force. Unlike a grease or the like, the blob 12 advantageously may be form-stable at normal room temperature such that part or component to which it is applied may be handled for assembly or otherwise. Moreover, unlike conventional form-in-place compounds which may bond to the surfaces, the compound of the invention may be readily cleaned or otherwise removed from the surfaces 16 for repair or rework.

Figure 2:
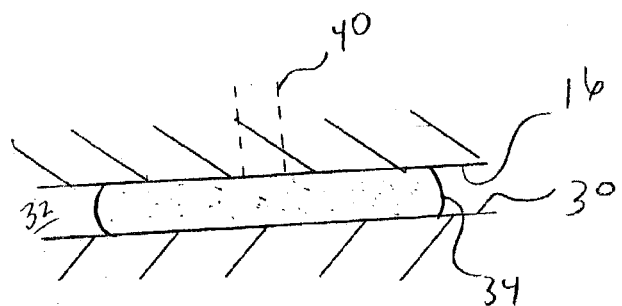
FIG. 2 is a cross-sectional view showing a surface, such as the surface of FIG. 1, being disposed in opposing a mating surface to form an interface gap therebetween, with an applied bead, mass, or other form of the compound of the present invention being shown to be conformable between the surfaces to at least partially fill the gap.

Turning now to FIG. 2, an assembly view is shown wherein the surface 16 having the applied blob 12 has been disposed in opposition, or other thermal adjacency, to a mating surface, 30, which again may be that of a heat sink, cold plate, circuit board, housing part, or electronic component, to define a gap, referenced at 32, therebetween which may range, for example, from about 2 mils (0.05 mm), or less, to about 100 mils (2.5 mm), or more. Within the gap 32, the compound, now referenced as the layer 34, may be seen to conform to the surfaces 16 and 30, and to at least partially fill the gap 32. Advantageously, the conformance of layer 34 may be effected under a relative low or substantially no force, that is, for example, a compression or force deflection of about 25% at about 0.3 psi (2 kPa), and of about 50% at about 1 psi (6 kPa) or less.

Figure 3:
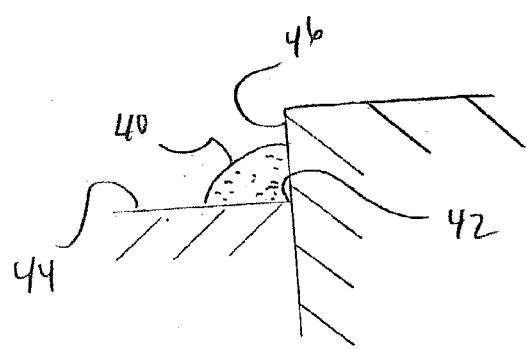
FIG. 3 is a cross-sectional view showing an alternative application of the compound of the invention as a caulk.

Alternatively, the compound forming the layer 34 may be injected directly into the gap 32, such as via an opening, referenced in phantom at 40, formed through one of the surfaces 16 or 30. Also, and with reference now to FIG. 3, the compound may be applied instead as a bead, 40, such as along a seam, 42, within a gap between adjoining surfaces 44 and 46.

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. A method of filling a gap between a first and a second surface, the method comprising the steps of:
  (a) providing a supply of a fluent, form-stable compound comprising an admixture of: (I) a cured polymer gel component; and (II) a particulate filler component;
  (b) providing an orifice connected in fluid communication with the supply of the compound;
  (c) dispensing from the orifice under an applied pressure an amount of the compound; and
  (d) prior to or following step (c), forming the gap between the first and the second surface, the gap being at least partially filled by at least a portion of the compound dispensed in step (c),
  wherein the cured gel component in the compound as dispensed from the orifice in step (c) does not exhibit further appreciable curing.

2. The method of claim 1 wherein:
the compound dispensed in step (c) is dispensed onto one of the first and the second surface; and
the gap of step (d) is formed following step (d) by disposing the one of the first and the second surfaces as adjoining the other of the first and the second surface, with the compound dispensed in step (c) being deflected therebetween to at least partially fill the gap.

3. The method of claim 1 wherein:
the gap of step (d) is formed prior to step (d); and
the compound dispensed in step (c) is dispensed into the gap.

4. The method of claim 1 wherein the compound comprises, by total weight of the components (I) and (II), between about 20–80% of the filler component.

5. The method of claim 1 wherein the filler component has a mean average particle size of between about 0.01–10 mil (0.25–250 μm).

6. The method of claim 1 wherein the gap formed in step (d) has a thickness of between about 2–100 mils (0.05–2.5 mm).

7. The method of claim 1 wherein:
the gap is a thermal gap; and
the filler component is thermally-conductive.

8. The method of claim 7 wherein the filler component has a thermal conductivity of at least about 20 W/m-K.

9. The method of claim 7 wherein the filler component is selected from the group consisting of oxide, nitride, carbide, diboride, graphite, and metal particles, and mixtures thereof.

10. The method of claim 7 wherein the compound has a thermal conductivity of at least about 0.5 W/m-K.

11. The method of claim 1 wherein the compound has a viscosity of about 15 million cps at about 25–30° C.

12. The method of claim 1 wherein the compound is provided in step (a) as charged into a container.

13. The method of claim 2 wherein the compound is substantially self-adherent to at least the one of the first and the second surface onto which the compound is dispensed in step (c).

14. The method of claim 1 wherein:
the gap is an EMI shielding gap; and
the filler component is electrically-conductive.

15. The method of claim 14 wherein the compound has an electrical volume resistivity of not greater than about 1 Ω-cm.

16. The method of claim 1 wherein the compound exhibits an EMI shielding effectiveness of-at least about 60 dB substantially over a frequency range of between about 10 MHz and about 10 GHz.

17. The method of claim 1 wherein the polymer gel component comprises a silicone polymer.

* * * * *

UNITED STATES PATENT AND TRADEMARK OFFICE
CERTIFICATE OF CORRECTION

| | | |
|---|---|---|
| PATENT NO. | : 7,208,192 B2 | Page 1 of 1 |
| APPLICATION NO. | : 10/346346 | |
| DATED | : April 24, 2007 | |
| INVENTOR(S) | : Michael H. Bunyan et al. | |

It is certified that error appears in the above-identified patent and that said Letters Patent is hereby corrected as shown below:

Title page & Col. 1, item 54, please change "THERMALLY OR ELECTRICALLY CONDUCTIVE FORM-IN PLACE GAP FILTER" TO --THERMALLY OR ELECTRICALLY CONDUCTIVE FORM-IN-PLACE GAP FILLER--

Signed and Sealed this

Nineteenth Day of June, 2007

JON W. DUDAS
*Director of the United States Patent and Trademark Office*